United States Patent
Terada et al.

(10) Patent No.: US 7,149,267 B2
(45) Date of Patent: Dec. 12, 2006

(54) INPUT CIRCUIT AND OUTPUT CIRCUIT

(75) Inventors: Yutaka Terada, Osaka (JP); Takefumi Yoshikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/995,124

(22) Filed: Nov. 24, 2004

(65) Prior Publication Data

US 2005/0094426 A1    May 5, 2005

Related U.S. Application Data

(62) Division of application No. 09/299,659, filed on Apr. 27, 1999, now Pat. No. 6,829,316.

(30) Foreign Application Priority Data

Apr. 28, 1998  (JP)  ............................. 10-118349

(51) Int. Cl.
*H04L 7/00*    (2006.01)
(52) U.S. Cl. ........................ 375/358; 375/371
(58) Field of Classification Search ............. 375/358, 375/371
See application file for complete search history.

(56) References Cited

U.S. PATENT DOCUMENTS

| | | | |
|---|---|---|---|
| 4,819,251 A | 4/1989 | Nelson | |
| 5,636,165 A | 6/1997 | Amatangelo et al. | |
| 5,663,914 A | 9/1997 | Kwon | |
| 5,712,884 A | 1/1998 | Jeong | |
| 5,732,027 A | 3/1998 | Arcoleo et al. | |
| 5,952,857 A | 9/1999 | Suzuki | |
| 5,963,606 A * | 10/1999 | Drost et al. | 375/371 |
| 6,157,229 A | 12/2000 | Yoshikawa | |
| 6,178,212 B1 * | 1/2001 | Akashi | 375/355 |
| 6,275,547 B1 | 8/2001 | Saeki | |

FOREIGN PATENT DOCUMENTS

| | | |
|---|---|---|
| EP | 0884732 | 6/1998 |
| GB | 2316208 | 2/1998 |
| JP | 63-9220 | 1/1988 |
| JP | 05-14167 | 1/1993 |
| JP | 05-83111 | 4/1993 |

(Continued)

*Primary Examiner*—Kevin Kim
(74) *Attorney, Agent, or Firm*—McDermott Will & Emery LLP

(57) ABSTRACT

An input circuit includes: a comparator; first and second delay circuits; a selector; an input buffer; and a holding circuit. The comparator compares the leading and/or trailing edges of a data signal, supplied from the input buffer, to an edge of a clock signal on which the data signal is intended to be latched. Based on the results of the comparison, the first and second delay circuits delay the clock signal for respectively predetermined amounts of time. If the data signal is logically high, then the selector selects a delayed clock signal supplied from the first delay circuit. Alternatively, if the data signal is logically low, then the selector selects another delayed clock signal supplied from the second delay circuit. Then, the delayed clock signal, selected by the selector, is latched in the holding circuit. The input circuit with such a configuration prevents skewing from being caused by a difference in length between the transition interval of the data signal from H into L level and that of the data signal from L into H level. As a result, data can be transferred at a much higher speed even if the clock frequency is very high.

5 Claims, 6 Drawing Sheets

FOREIGN PATENT DOCUMENTS

| | | |
|---|---|---|
| JP | 05-110550 | 4/1993 |
| JP | 07-86900 | 3/1995 |
| JP | 07131311 | 5/1995 |
| JP | 08-194664 | 7/1996 |
| JP | 08-237101 | 9/1996 |
| JP | 09-162706 | 6/1997 |

* cited by examiner

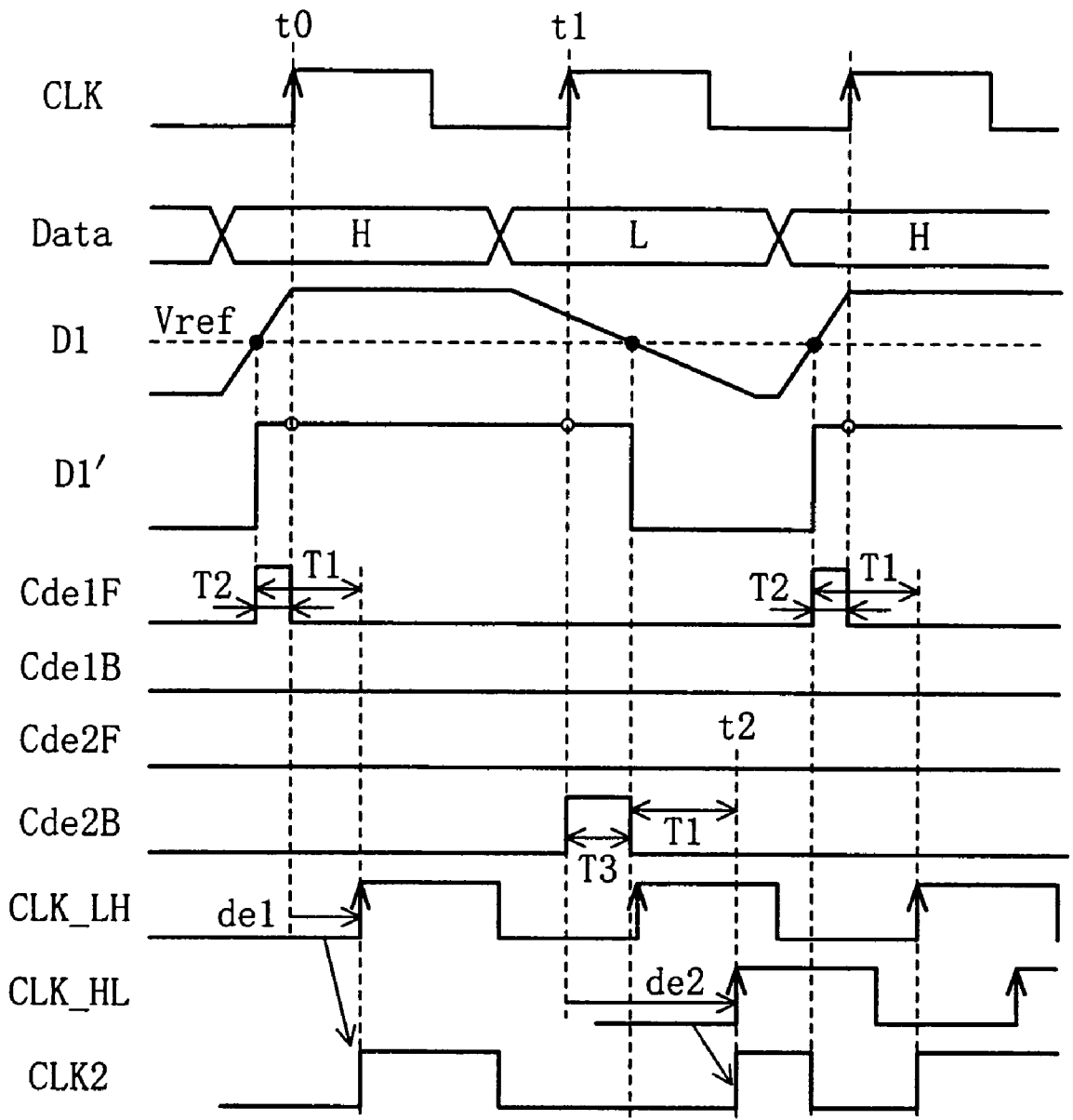
Fig. 2(a)  Con=H
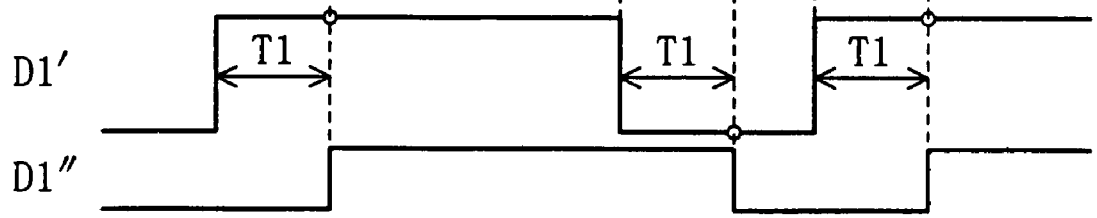
Fig. 2(b)  Con=L

INPUT CIRCUIT AND OUTPUT CIRCUIT

This application is a divisional of application Ser. No. 09/299,659 filed Apr. 27, 1999 now U.S. Pat. No. 6,829,316.

BACKGROUND OF THE INVENTION

The present invention relates to input circuit and out-put circuit for transferring data within a semiconductor integrated circuit at a much higher speed.

As the multimedia applications have been expanding in recent years, improvement of operating performance of a semiconductor device has become more and more pressing task to be fulfilled. That is to say, an ideal operating speed of a semiconductor device has been steeply rising, and desired power consumption of the device has been drastically falling. In particular, a system, like an image processor, which is intended to process a large quantity of data at a high speed, strongly needs a semiconductor device operative at an extremely high speed. Generally speaking, in order to operate a device at a high speed, data should be transferred within the device at a high speed, which in turn requires some high-speed data transfer technique. High-speed-transfer-related technology includes speeding up the operation of an input/output circuit and adopting a high-speed transfer standard for a data bus. Also, input circuits of various types have become popular lately. Examples of those circuits include: a differential input circuit for comparing a voltage of a signal received to a reference voltage and amplifying the voltage of the received signal based on the difference therebetween; and a differential input circuit for receiving differential (or complementary), signals and outputting a single signal.

If an output circuit for outputting a data signal has a push-pull configuration, however, it is very difficult to match its output impedance, or its output current, when each driver transistor outputs H-level data with its output impedance or current when each transistor outputs L-level data. In this specification, "L-level data" and "H-level" data means data with a voltage level defined as logically low (i.e., the voltage level is lower than a certain reference level) and data with a voltage level defined as logically high (i.e., the voltage level is higher than the reference level), respectively. Also, if an output circuit for outputting a data signal is a pull-up output circuit including a pull-up resistor connected to the output thereof, it is hard to equalize a current flowing through the resistor with that flowing through a transistor for outputting the data signal.

In view of the state of the art, the length of a transition interval from L to H level of a data signal is not equal to that of its transition interval from H to L level. Thus, an interval during which the voltage level of such a data signal received by a receiver is defined as logically high judging from the reference voltage is not equal in length to an interval during which that of the data signal is defined as logically low. If such a data signal is transferred and held at irregular intervals in response to a clock signal with regular pulses, then skewing is more likely to happen. As a result, the receiver might operate erroneously, thus interfering with the speedup of a system. The higher the intended speed of a system is, the more seriously such skewing is affecting. In general, the length of a data transition interval is on the orders of several hundreds picoseconds to several nanoseconds. Thus, if a high-speed operation should be performed responsive to a clock signal at a frequency of several hundreds megahertz (i.e., one cycle of the clock signal is several nanoseconds), then the data transition intervals account for as much as several tens percent of one cycle of the clock signal. Thus, skewing is very likely to happen in such a situation.

SUMMARY OF THE INVENTION

An object of the present invention is providing input and output circuits contributing to a high-speed operation by suppressing skewing, resulting from a difference in length between the transition interval of an input data signal from H to L level and its transition interval from L to H level.

In the input circuit of the present invention, to correct such a difference in length between these two types of transition intervals of a data signal received, a clock signal is delayed based on at least one of these two transition intervals of the data signal. And the received data signal is latched using at least one of these two types of delayed clock signals and/or the original clock signal.

Also, to correct such a difference in length between these two transition intervals of a data signal to be transmitted, the output circuit of the present invention is adapted to control the drivability of a driver thereof outputting the data signal.

Specifically, an input circuit according to the present invention includes: delay means for defining a delay time for at least one logical state of a data signal and thereby delaying the clock signal for the delay time defined; and a holding circuit for holding the data signal responsive to the delayed clock signal.

In one embodiment of the present invention, the delay means preferably defines the delay time such that an edge of the clock signal, on which the data signal is intended to be latched and which is included within a transition interval of the data signal, is delayed to a point in time after the transition interval of the data signal is over.

In this particular embodiment, the delay means may include: a comparator for comparing the edge of the clock signal, on which the data signal is intended to be latched, to at least one of leading and trailing edges of the data signal; and a delay circuit for defining the delay time based on a result of comparison performed by the comparator.

In an alternate embodiment, the delay means may include: a comparator for comparing the edge of the clock signal, on which the data signal is intended to be latched, to leading and trailing edges of the data signal; a first delay circuit for defining the delay time for a logically high state of the data signal based on a result of comparison, performed by the comparator, between one of the leading edges of the data signal and the edge of the clock signal; a second delay circuit for defining the delay time for a logically low state of the data signal based on a result of comparison, performed by the comparator, between one of the trailing edges of the data signal and the edge of the clock signal; and a selector for selecting the delay time defined by the first delay circuit when the data signal is in the logically high state or the delay time defined by the second delay circuit when the data signal is in the logically low state.

In another embodiment, the delay circuit may define the delay time based on the result of comparison performed by the comparator and a setup time for correctly latching the data signal.

An output circuit according to the present invention includes: a driver including a plurality of devices outputting a data signal, the total drivability of the devices being controllable; and a controller, responsive to a signal representing a transition interval length of the data signal, for increasing or decreasing the drivability of the driver.

In one embodiment of the present invention, the controller preferably receives the signal, representing the transition interval length of the data signal, from an input circuit to which the data signal is output from the output circuit.

The input circuit of the present invention can prevent erroneous latching. For example, suppose the transition interval of a data signal from H into L level is relatively long. In such a case, even though an edge of the original clock signal, on which the data signal is usually latched, is included within the transition interval, the original clock signal is delayed for a relatively long amount of time defined for the logically state of the data signal. Accordingly, an edge of the delayed clock signal, on which the data signal is actually latched, is located at a point in time after the transition of the data signal into the L level is over. As a result, the L-level data signal can be latched correctly with a lot more certainty.

The output circuit of the present invention can also prevent erroneous latching. For example, suppose the transition interval of a data signal from H into L level is relatively long. In such a case, even though an edge of the clock signal, on which the data signal is usually latched, is included within the transition interval, the transition interval can be shortened, because the drivability of the driver is increased. Thus, the edge of the clock signal, on which the data signal is actually latched, is located at a point in time after the shortened transition interval of the data signal into the L level is over. As a result, the L-level data signal can be latched correctly with a lot more certainty.

BRIEF DESCRIPTION OF THE DRAWINGS

FIG. 2(a) is a timing diagram illustrating a test-mode operation of the input circuit of the first embodiment; and FIG. 2(b) is a timing diagram illustrating a normal-mode operation of the input circuit of the first embodiment.

DESCRIPTION OF THE PREFERRED EMBODIMENTS

Hereinafter, preferred embodiments of the present invention will be described with reference to the accompanying drawings.

Embodiment 1

Figure 3:
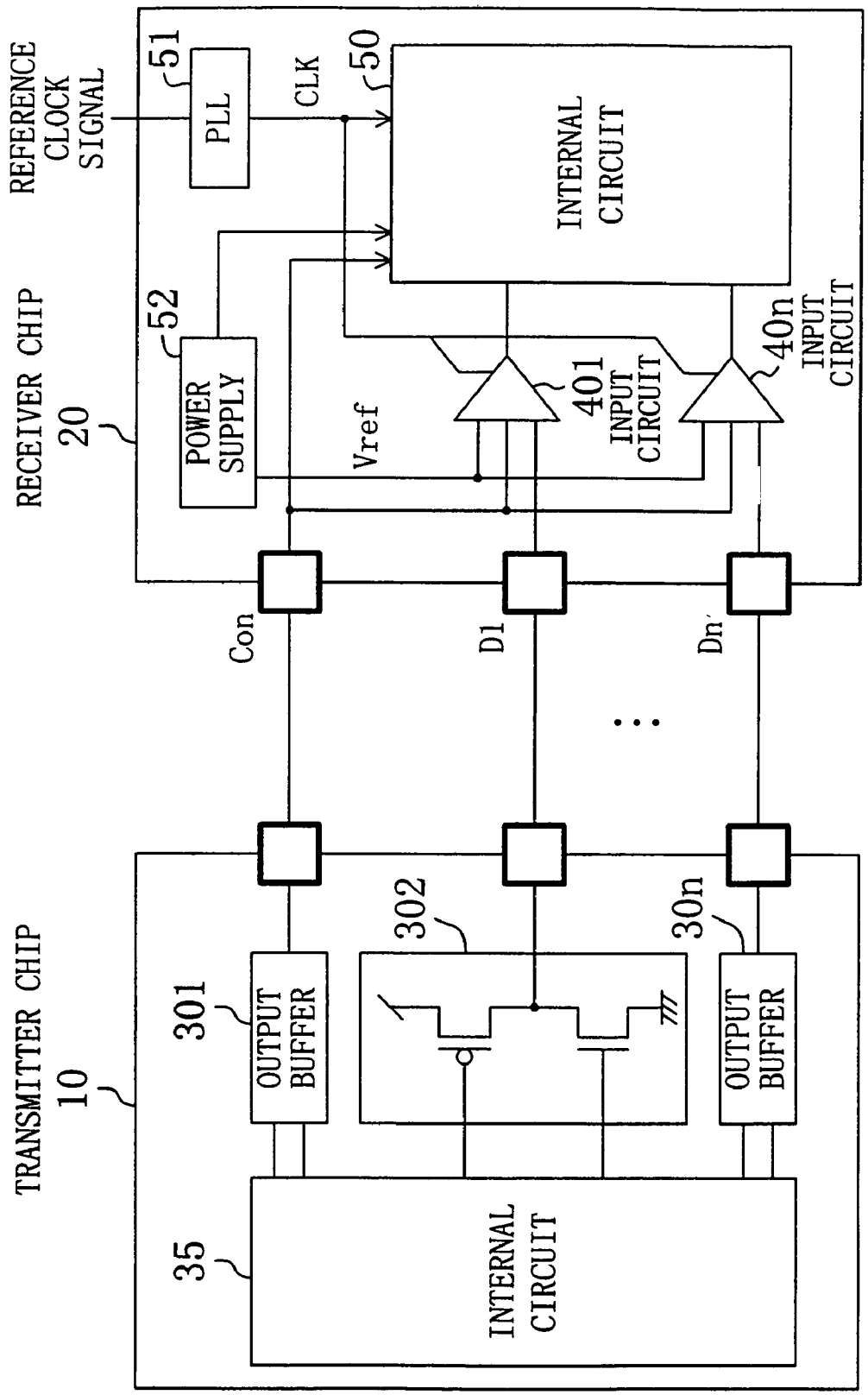
FIG. 3 is a block diagram illustrating a schematic arrangement of a data signal transmitting/receiving system including transmitter and receiver chips according to the first embodiment.

FIGS. 1, 2, 3 and 4 illustrate a first exemplary embodiment of the present invention. FIG. 3 illustrates an overall arrangement of a data signal transmitting/receiving system including transmitter and receiver chips.

As shown in FIG. 3, the transmitter chip 10 includes a plurality of, or a number n of, output buffers 301, 302, ..., 30n and an internal circuit 35. The internal circuit 35 sends out a mode-switching signal Con for switching a test mode into a normal operation mode, or vice versa, and data signals D1, D2, ..., Dn to the receiver chip 20 via these output buffers 301 through 30n.

Figure 4:
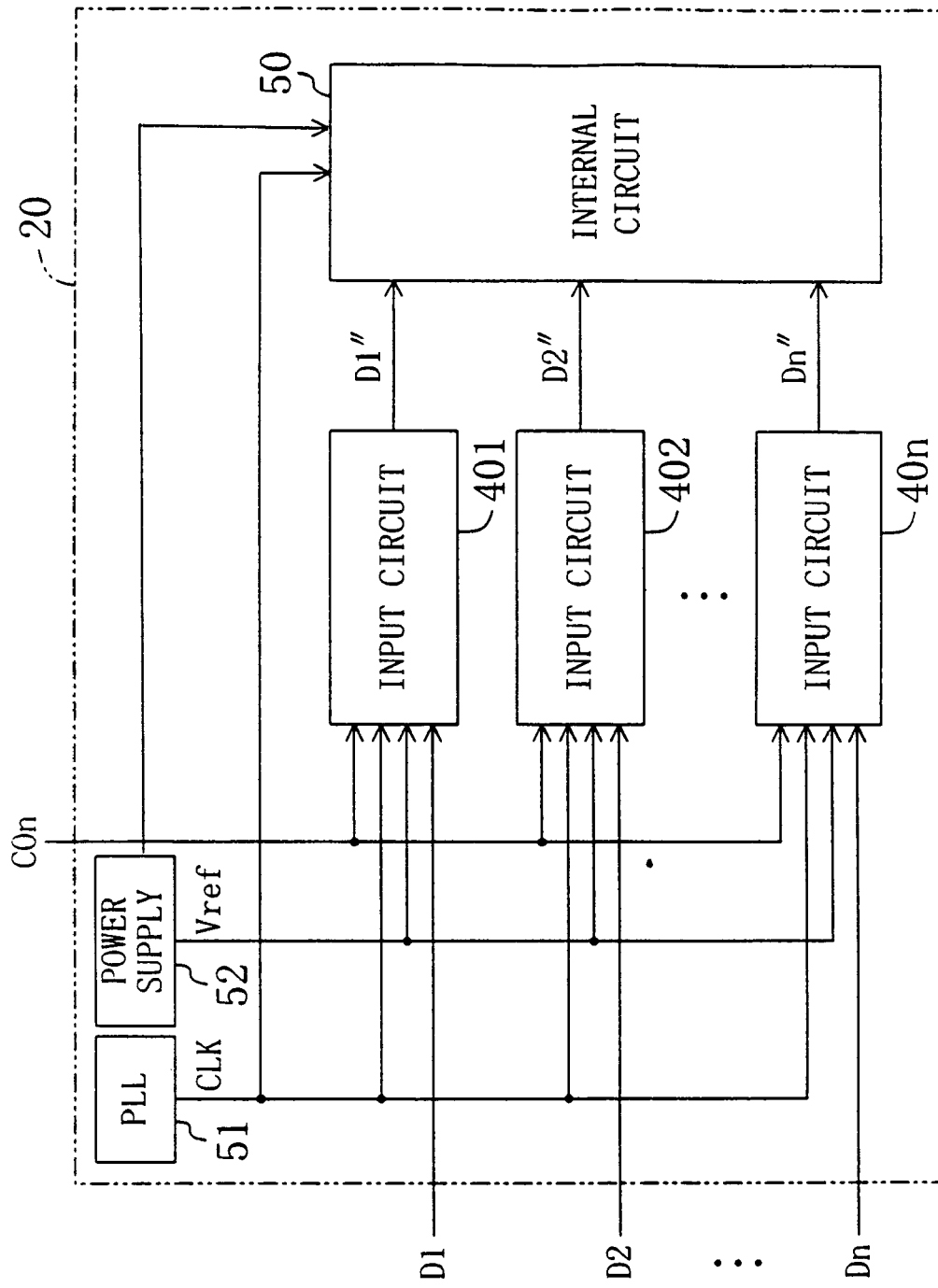
FIG. 4 is a block diagram illustrating an internal configuration of the receiver chip.

As shown in FIGS. 3 and 4, the receiver chip 20 includes: a number n of input circuits 401, 402, ..., 40n; an internal circuit 50; a phase locked loop (PLL) circuit 51; and a power supply circuit 52. The input circuits 401 through 40n respectively hold the data signals D1, D2, ..., Dn received. The data signals D1", D2", ..., Dn", which are held in these input circuits 401 through 40n, are then supplied to the internal circuit 50. Responsive to a reference clock signal, the PLL circuit 51 generates a clock signal CLK and supplies the clock signal CLK to the internal circuit 50. The power supply circuit 52 supplies a power supply voltage to the internal circuit 50 and a reference voltage Vref (described later) to the respective input circuits 401 through 40n.

Figure 1:
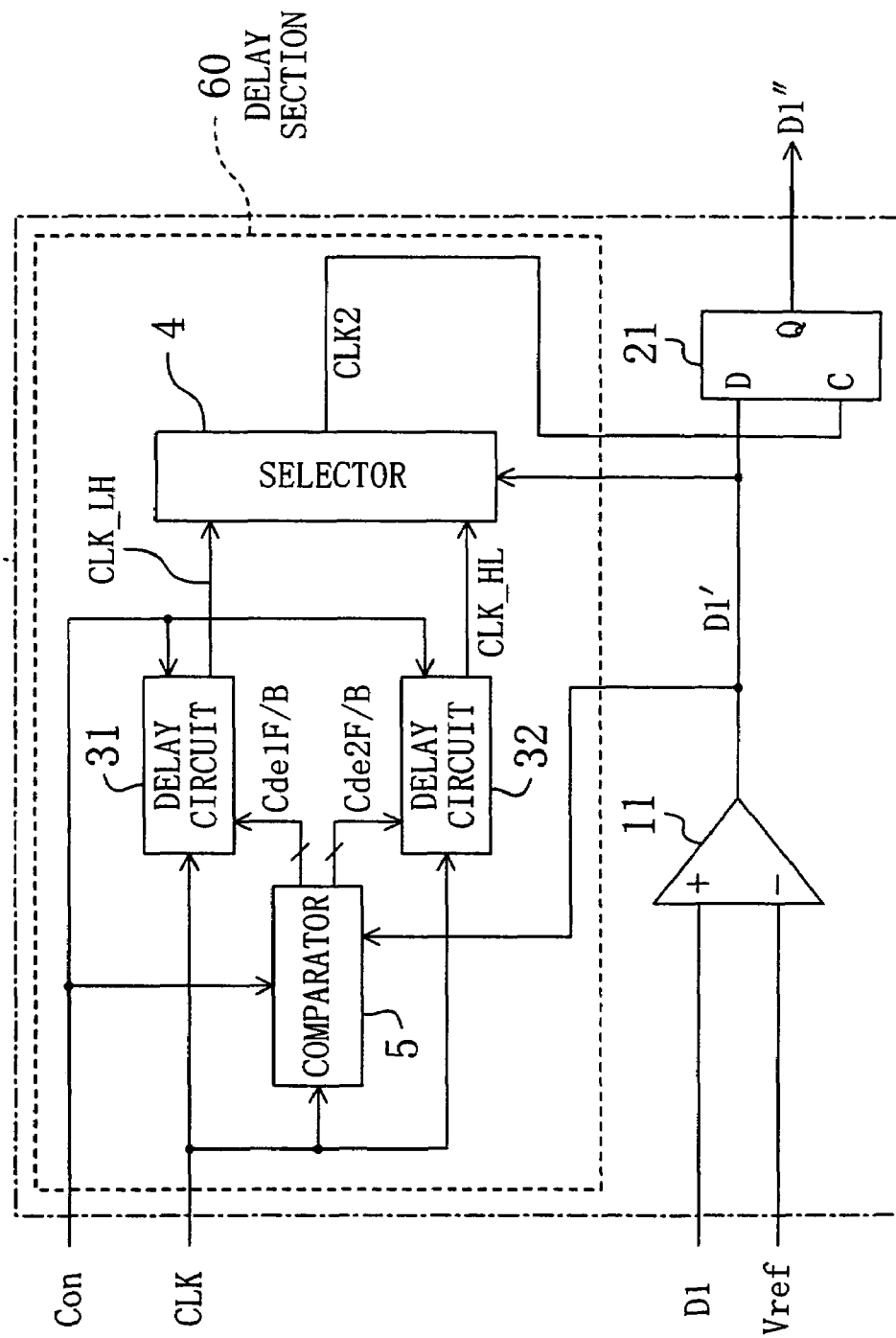
FIG. 1 is a block diagram illustrating an internal configuration of an input circuit according to a first embodiment of the present invention.

FIG. 1 illustrates an internal configuration of the input circuit 401. It should be noted that the other input circuits 402 through 40n also have the same configuration as that of the input circuit 401 shown in FIG. 1.

As shown in FIG. 1, the input circuit 401 includes: an input buffer 11; a delay section 60; and a holding circuit 21. The delay section 60 includes: a comparator 5; two delay circuits 31 and 32; and a selector 4.

The input buffer 11 is a differential amplifier (differential input device), which receives the reference voltage Vref and the data signal D1 and outputs an amplified signal D1' based on the difference between the voltage of the data signal D1 and the reference voltage Vref. The reference voltage Vref is set equal to or lower than the power supply voltage and higher than a ground potential. If the voltage of the input signal D1 is higher than the reference voltage Vref, then the input buffer 11 outputs the power supply voltage as the "H-level" potential (i.e., logically high voltage). Alternatively, if the voltage of the input signal D1 is lower than the reference voltage Vref, then the input buffer 11 outputs the ground potential as the "L-level" potential (i.e., logically low voltage).

The holding circuit 21 is implemented as a D-latch, which holds the amplified data signal D1' supplied from the input buffer 11 in synchronism with a leading edge of a clock signal CLK2 delayed by the delay circuit 31 or 32, and then outputs latched data signal D1". That leading edge of the delayed clock signal CLK2 is equivalent to the edge on which the data signal is latched as defined in the appended claims.

The comparator 5 compares the phase of the amplified data signal D1' to that of the clock signal CLK. The result of phase comparison between a leading edge of the data signal D1' (i.e., transition from L into H level) and a corresponding leading edge of the clock signal CLK is output as a signal Cde1F or Cde1B. If the leading edge of the data signal D1' is prior to that of the clock signal CLK, then a pulse with a width equal to the phase difference therebetween is output as the signal Cde1F. Conversely, if the leading edge of the data signal D1' is posterior to that of the clock signal CLK, then a pulse with a width equal to the phase difference therebetween is output as the signal Cde1B. Similarly, the result of phase comparison between a trailing edge of the data signal D1' (i.e., transition from H into L level) and an associated leading edge of the clock signal CLK is output as a signal Cde2F or Cde2B. If the trailing edge of the data signal D1' is prior to the leading edge of the clock signal CLK, then a pulse with a width equal to the phase difference therebetween is output as the signal Cde2F. Conversely, if the trailing edge of the data signal D1' is posterior to the leading edge of the clock signal CLK, then a pulse with a width equal to the phase difference therebetween is output as the signal Cde2B.

The delay circuits 31 and 32 can delay the clock signal CLK for respective amounts of time variable with the results of phase comparison represented by the signals Cde1F/Cde1B and Cde2F/Cde2B received from the comparator 5. The first delay circuit 31 outputs a delayed clock signal CLK_LH derived by delaying the clock signal CLK for the amount of time determined by the signal Cde1F or Cde1B. Similarly, the second delay circuit 32 outputs a delayed clock signal CLK_HL derived by delaying the clock signal CLK for the amount of time determined by the signal Cde2F or Cde2B. The delay circuits 31 and 32 and the comparator 5 are activated while the mode-switching signal Con is high, but are deactivated while the mode-switching signal Con is low.

If the data signal D1' is logically high, then the selector 4 selects the signal CLK_LH output from the delay circuit 31. Alternatively, if the data signal D1' is logically low, then the selector 4 selects the signal CLK_HL output from the delay circuit 32. Then, the selector 4 outputs the selected signal CLK_LH or CLK_HL as the clock signal CLK2 to the holding circuit 21.

Next, the operation of the input circuit of the present invention will be described separately in terms of test and normal operation modes thereof.

FIGS. 2(a) and 2(b) are timing diagrams illustrating the operation of the input circuit in the test mode and the normal operation mode, respectively.

(Test Mode)

First, a test mode interval (initializing interval) is provided to determine the respective amounts of time for which the clock signal CLK should be delayed.

When the signal Con reaches the H level, the initializing interval starts. At the outset of the initializing interval, the data signal Data, which repeatedly alternates its level between H and L, is output as test data from the transmitter chip 10 to the receiver chip 20. As shown in FIG. 2(a), the length of the transition interval of the data signal D1 from L into H is different from that of the transition interval of the data signal D1 from H into L. Accordingly, the length of an interval during which the data signal D1' amplified by the input buffer 11 is high is not equal that of an interval during which the signal D1' is low.

In this embodiment, in holding the data signal D1' responsive to a clock signal, a setup time T1 of a sufficient length is determined in advance, which accounts for about 30% to about 50% of one cycle of the clock signal. Also, this setup time T1 is a relatively long period of time, which is longer than phase difference T2 or T3 described below. Suppose a leading edge of the data signal D1' turns out to be prior to an associated leading edge of the clock signal CLK as a result of phase comparison between the data signal D1' and the clock signal CLK by the comparator 5. Then, the delay circuit 31 determines the delay time de1 as T1−T2, where T2 is a phase difference between these leading edges of the data signal D1' and the clock signal CLK. On the other hand, if a leading edge of the data signal D1' turns out to be posterior to an associated leading edge of the clock signal CLK, then the delay circuit 31 determines the delay time de1 as T1+T2. Moreover, suppose a trailing edge of the data signal D1' turns out to be posterior to an associated leading edge of the clock signal CLK. Then, the delay circuit 32 determines the delay time de2 as T1+T3, where T3 is a phase difference between the trailing edge of the data signal D1' and the leading edge of the clock signal CLK. Furthermore, if a trailing edge of the data signal D1' turns out to be prior to an associated leading edge of the clock signal CLK, then the delay circuit 32 determines the delay time de2 as T1−T3. Accordingly, each leading edge of the delayed clock signal CLK2 is always delayed from its associated leading or trailing edge of the data signal D1' for the setup time T1.

Once the delay time has been determined by the delay circuit 31 or 32 in this manner, the delay circuit 31 or 32 delays the clock signal CLK for the determined amount of time, thereby outputting the delayed clock signal CLK_LH or CLK_HL. Specifically, one delayed clock signal CLK_LH is obtained by having the clock signal CLK delayed by the first delay circuit 31. The delay time thereof is determined based on the phase difference between a leading edge of the data signal D1, and an associated leading edge of the clock signal CLK during the transition of the data signal D1' from L into H level. On the other hand, the other delayed clock signal CLK_HL is obtained by having the clock signal CLK delayed by the second delay circuit 32. The delay time thereof is determined based on the phase difference between a trailing edge of the data signal D1' and an associated leading edge of the clock signal CLK during the transition of the data signal D1' from H into L level.

The initializing interval terminates when this timing control is completed.

(Normal Operation Mode)

Next, when the mode-switching signal Con falls to the L level, the input circuit enters the normal operation mode.

In this operation mode, a data signal is transferred as in an ordinary data transfer operation. The operation of holding a data signal in the holding circuit 21, however, is performed responsive to a delayed clock signal CLK2, which is selected from the two delayed clock signals CLK_HL and CLK_LH derived during the initializing interval. The selector 4 selects one of the delayed clock signals CLK_HL and CLK_LH based on the logical state of the data signal D1'. Specifically, if the data signal D1' is currently logically high, then the selector 4 selects the signal CLK_LH. Alternatively, if the data signal D1' is logically low, then the selector 4 selects the signal CLK_HL. The signal selected by the selector 4 is supplied as the delayed clock signal CLK2 to the holding circuit 21, which holds the data signal D1' in synchronism with the leading edge of the delayed clock signal CLK2.

By reducing a phase difference between a leading or trailing edge of the data signal D1' and an associated leading edge of the delayed clock signal CLK2 in this manner, the data signal D1' can be held correctly and erroneous latching can be prevented.

Figure 6:
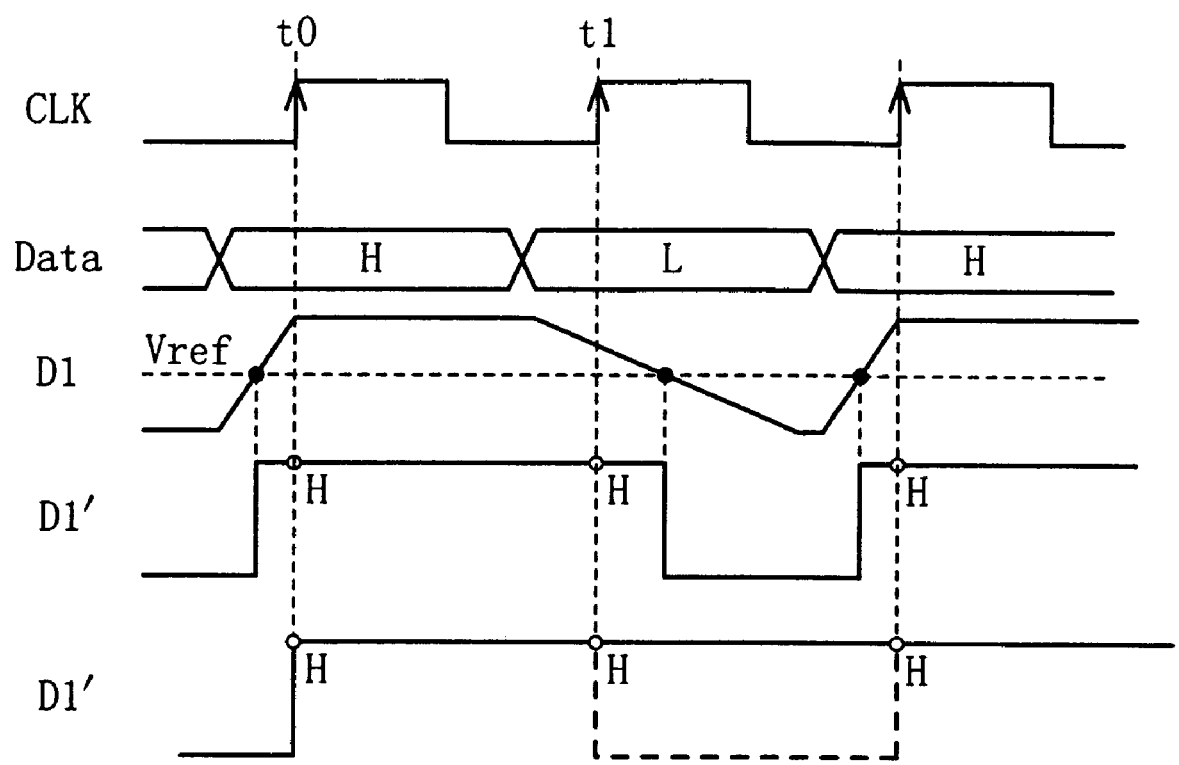
FIG. 6 is a timing diagram how erroneous latching happens when the transition interval of a data signal from H into L level is long.

Next, the operation of the input circuit of the present invention as shown in FIG. 2 and that of a conventional circuit, in which data is latched on every leading edge of an input clock signal CLK without using the selector 4 as shown in FIG. 6, will be described in comparison. As shown in FIGS. 2 and 6, at a time t0 synchronous with the first leading edge of the clock signal CLK, the data signal D1', supplied from the differential amplifier 11, has a voltage higher than the reference voltage Vref, and is logically high. Thus, in FIG. 6, if the data signal D1' is latched on the first leading edge of the clock signal CLK, then the data signal D1" is correctly latched in the holding circuit 21 as logically high. In FIG. 2, the data signal D1' is latched on the first leading edge of the delayed clock signal CLK_LH, which is delayed from that of the clock signal CLK for a time T1–T2. However, the data signal D1' in the logically high state may be correctly latched on the first leading edge of the input clock signal CLK as in FIG. 6. Thus, according to the present invention, two kinds of delay times, corresponding to the two logical states of the data signal D1' (i.e., H and L levels), do not always have to be calculated. That is to say, according to the present invention, only one of the delayed clock signals CLK_LH or CLK_HL may be selectively produced for one of these two logical states. Responsive to this delayed clock signal, the data signal D1' in one of the two logical states may be latched. But the data signal D1' in the other logical state may be latched responsive to the original clock signal CLK without calculating the delay time for the other logical state. In such a case, the selector 4 receives the clock signal CLK_LH or CLK_HL delayed by one of the two delay circuits (e.g., 31) and the original clock signal CLK.

According to the present invention, the setup time T1 does not always have to be provided. However, in order to latched the data signal D1' during a steady-state interval (in which the voltage is constant) after the transition interval of the data signal D1' is over, the setup time T1 should preferably be provided.

Next, at a time t1 synchronous with the next leading edge of the clock signal CLK, the data signal D1' supplied from the differential amplifier 11 is in the middle of level transition, but still has a voltage higher than the reference voltage Vref. That is to say, the data signal D1' is logically high at the time t1 in both FIGS. 2 and 6. Thus, in FIG. 6, if the data signal D1' is latched at the time t1 synchronous with the second leading edge of the clock signal CLK, the holding circuit 21 holds the H-level data signal D1', not the correct L-level data signal D1' as indicated by the broken line. As a result, erroneous data is latched. In contrast, in this embodiment, the L-level data signal D1' is latched correctly by the holding circuit 21 at a time t2 synchronous with the leading edge of the delayed clock signal CLK_HL obtained by delaying the clock signal CLK for the predetermined amount of time de2 (=T1+T3) as shown in FIG. 2. That is to say, the data signal D1' is latched after the voltage of the data signal D1' has fallen to be lower than the reference voltage Vref. As a result, the present invention can prevent erroneous latching.

In this embodiment, the data signal D1' is supposed to be in the same logical state during one cycle of the clock signal, i.e., the frequency of the data signal is supposed to be one half as high as that of the clock signal. However, the application of the present invention is not limited to such a situation. Thus, the applicable frequencies of the data and clock signals are not particularly limited according to the present invention.

In the foregoing embodiment, the data signal D1' is supposed to be latched on the leading edges of the clock signal. Alternatively, the data signal may also be latched either on the trailing edges of the clock signal or on the leading and trailing edges thereof in combination.

Furthermore, in the foregoing embodiment, the first or second delay circuit 31 or 32 is selectively used. Specifically, the clock signal delayed by the first delay circuit 31 is supposed to be selected when the data signal is logically high, while the clock signal delayed by the second delay circuit 32 is supposed to be selected when the data signal is logically low. However, if it is clear that only the leading edges of the data signal are posterior to associated leading edges of the clock signal, then the phase may be controlled at only these leading edges of the data signal D1' by using only the first delay circuit 31. Also, if it is clear that only the trailing edges of the data signal are posterior to associated leading edges of the clock signal, then the phase may be controlled at only these trailing edges of the data signal D1' by using only the second delay circuit 32. In any of these cases, the selector 4 is not necessary. Moreover, in the foregoing description, the setup time T1 is supposed to be constant if the time is long enough to hold the data. However, if the time T1 is varied responsive to another external control signal, the input circuit can be modified to satisfy the demand of even higher-speed operation.

Embodiment 2

Next, a second exemplary embodiment of the present invention will be described with reference to FIG. 5.

Figure 5:
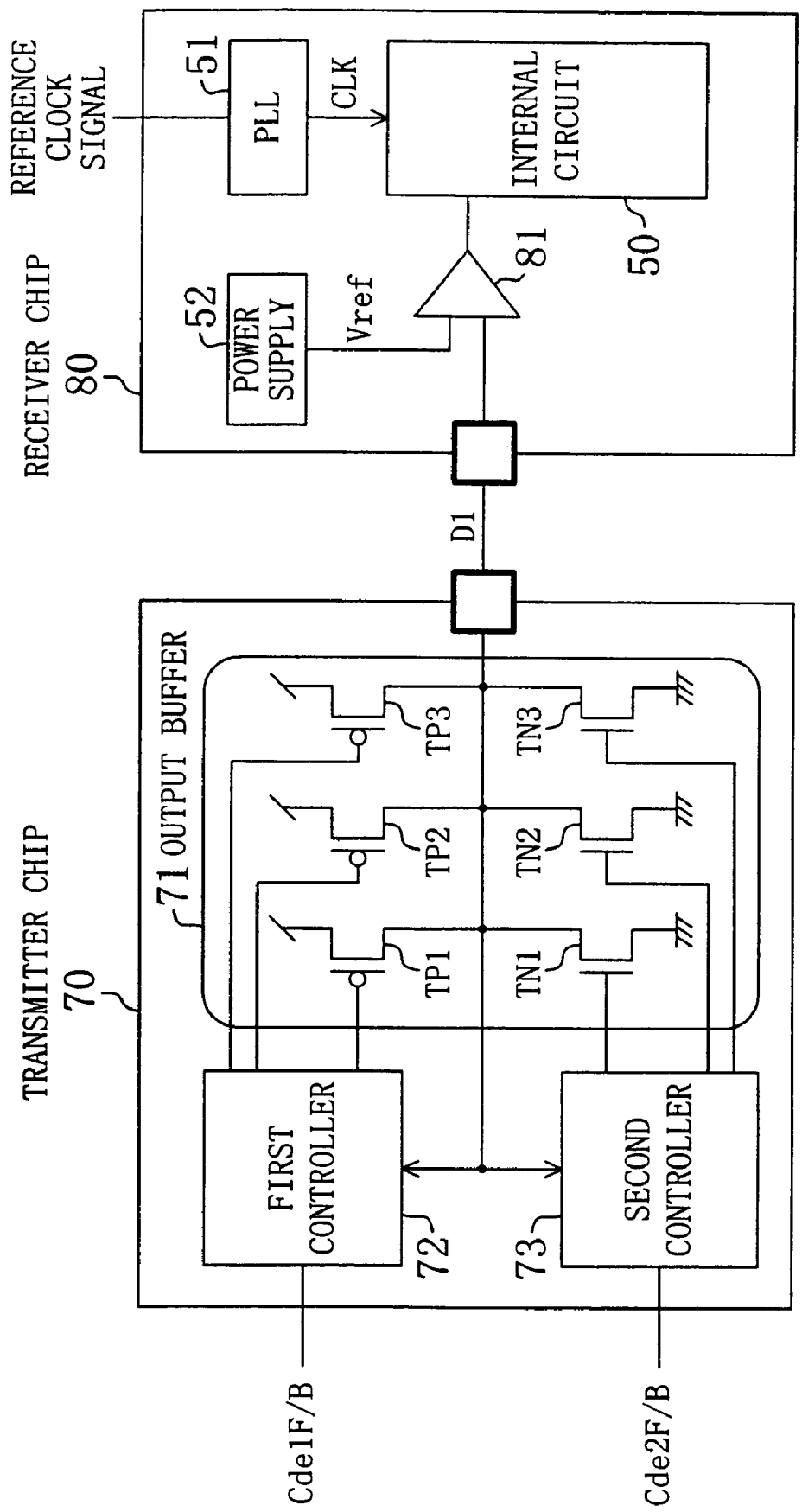
FIG. 5 is a block diagram illustrating a schematic arrangement of a data signal transmitting/receiving system including transmitter and receiver chips according to a second embodiment of the present invention.

In FIG. 5, a transmitter chip 70 (equivalent to the output circuit of the present invention as defined in the appended claims) transmits a plurality of data signals to be received by a receiver chip 80. It should be noted that only one data signal D1 is illustrated in FIG. 5 for the sake of simplicity. The receiver chip 80 includes the internal circuit 50, PLL circuit 51 and power supply circuit 52, all of which have the same configurations as the counterparts illustrated in FIG. 3. The receiver chip 80 further includes a plurality of input circuits (though only one input circuit 81 is illustrated in FIG. 5 for the sake of simplicity). In this embodiment, although not shown in any of the drawings, each of these input circuits includes only the differential amplifier 11, comparator 5 and holding circuit 21 of the input circuit 401 shown in FIG. 1. That is to say, the input circuit does not include the first and second delay circuits 31 and 32 and the selector 4. Responsive to the clock signal CLK supplied from the PLL circuit 51, the holding circuit 21 latches the data signal D1' supplied from the differential amplifier 11.

On the other hand, the transmitter chip 70 includes a plurality of output buffers each transmitting an associated data signal (although only one output buffer 71 for outputting the data signal D1 is illustrated in FIG. 5 for the sake of simplicity). Each of these output buffers has the same internal configuration. For example, the output buffer 71 includes three p-channel transistors TP1, TP2 and TP3, connected to the power supply, for turning the logical voltage level of the data signal D1 into high, and three n-channel transistors TN1, TN2 and TN3 grounded for turning the logical voltage level of the data signal D1 into low. The transmitter chip 70 further includes first and second controllers 72 and 73 for controlling the p-channel transistors TP1, TP2 and TP3 and n-channel transistors TN1, TN2 and TN3, respectively. The first controller 72 receives the signal Cde1F or Cde1B representing the result of comparison between a leading edge of the data signal D1' and an associated leading edge of the clock signal CLK, i.e., the signals representing the length of the transition interval of the data signal, from the comparator 5 in the input circuit 81. On the other hand, the second controller 73 receives the signal Cde2F or Cde2B representing the result of comparison between a trailing edge of the data signal D1' and an associated leading edge of the clock signal CLK, from the comparator 5 in the input circuit 81. These signals Cde1F/Cde1B and Cde2F/Cde2B are shown in FIG. 2. Suppose the signal Cde1B is supplied to the first controller 72, i.e., the time when the voltage of the data signal D1' rises to reach the reference voltage Vref is later than the leading edge of the clock signal CLK during the transition of the data signal D1' from L to H level. In other words, if the transition interval is relatively long, then the first controller 72 increases the number of p-channel transistors to be turned ON, thereby enhancing the total drivability of the output buffer 71 to shorten the transition interval. On the other hand, suppose the signal Cde2B is supplied to the second controller 73, i.e., the time when the voltage of the data signal D1' drops to reach the reference voltage Vref is later than the leading edge of the clock signal CLK during the transition of the data signal D1' from H to L level. In other words, if the transition interval is relatively long, then the second controller 73 also increases the number of n-channel transistors to be turned ON, thereby enhancing the total drivability of the output buffer to shorten the transition interval.

The data signal D1' is fed back to the first and second controllers 72 and 73. Accordingly, even if these controllers 72 and 73 do not receive the signals Cde1F/Cde1B and Cde2F/Cde2B from the comparator 5, the drivability of the output buffer 71 can be known based on the feedback signal. And if the drivability is low, the number of transistors to be turned ON may be increased.

Accordingly, in this embodiment, the drivability of the output buffer 71 can be controlled on the transmitting end, i.e., in the transmitter chip 70, thereby adjusting the length of the transition interval of the data signal D1' from H into L level or vice versa. Thus, as in the first embodiment, skewing can be suppressed and a high-speed operation is ensured in a frequency region where the clock frequency is several hundreds megahertz or more.

In the foregoing discussion, the present invention has been described as being applied to an input circuit receiving a single data signal D1'. However, the present invention is also applicable to an input circuit receiving differential input signals. In such a case, these differential signals are supplied to the differential amplifier 11.

What is claimed is:

1. A transmission system comprising:
    a transmitter, and
    a receiver coupled to said transmitter, said transmitter operable for outputting a data signal to said receiver, wherein said transmitter comprises:
        an output buffer including a plurality of signal driving devices; and
        a controller coupled to said output buffer, said controller operable for individually activating or deactivating each of said plurality of signal driving devices so as to control the signal drive capabilities of said output buffer, said controller individually activating or deactivating said plurality of signal driving devices in response to a signal representing a transition interval length of the data signal provided by said receiver,
    the receiver includes an input circuit for generating said signal representing the transition interval length of the data signal,
    wherein said input circuit outputs said signal representing the transition interval length of the data signal to said controller.

2. The transmission system of claim 1, wherein said output buffer includes a plurality of transistors, each of which has a gate terminal which is coupled to said controller.

3. The transmission system of claim 2, wherein said plurality of transistors includes p-type transistors and n-type transistors.

4. The transmission system of claim 3, wherein said controller includes a first controller operable for individually activating or deactivating each p-type transistor, and a second controller operable for individually activating or deactivating each n-type transistor.

5. The transmission system of claim 1, wherein said controller adjusts the drive signal capabilities so as to control the time required for the data signal to transition from a first logical state to a second logical state.

* * * * *